(12) United States Patent
Naitou et al.

(10) Patent No.: US 7,284,322 B2
(45) Date of Patent: Oct. 23, 2007

(54) PROCESS FOR PRODUCING ELECTRO-OPTIC HYBRID CIRCUIT BOARD

(75) Inventors: Ryuusuke Naitou, Osaka (JP); Hideyuki Usui, Osaka (JP); Amane Mochizuki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 112 days.

(21) Appl. No.: 11/285,358

(22) Filed: Nov. 23, 2005

(65) Prior Publication Data
US 2006/0120658 A1  Jun. 8, 2006

(30) Foreign Application Priority Data
Nov. 25, 2004  (JP)  ............ P.2004-340124

(51) Int. Cl.
*H05K 3/02* (2006.01)
(52) U.S. Cl. ............ 29/846; 29/832; 29/852; 385/2
(58) Field of Classification Search ........... 29/832, 29/846, 852; 385/2
See application file for complete search history.

(56) References Cited

U.S. PATENT DOCUMENTS 7,212,700 B2 * 5/2007 Naitou et al. ............ 385/14

2004/0047539 A1  3/2004  Okubora et al.
2004/0057688 A1  3/2004  Akutsu et al.

FOREIGN PATENT DOCUMENTS

| EP | 1 041 418 A2 | 10/2000 |
| EP | 1 369 255 A2 | 12/2003 |
| EP | 1 512 996 A1 | 3/2005 |
| JP | 2002-236228 A | 8/2002 |
| WO | WO 2004/060033 A1 | 7/2004 |

OTHER PUBLICATIONS

European Office Action dated Jul. 20, 2007.

* cited by examiner

*Primary Examiner*—Carl J. Arbes
(74) *Attorney, Agent, or Firm*—Sughrue Mion Pllc.

(57) ABSTRACT

The present invention provides a process for producing an electro-optic hybrid circuit board, which comprises the steps of: forming an undercladding layer on a metal foil side of a metal transfer sheet that comprises a releasable substrate and a metal foil formed thereon; forming a core layer on the undercladding layer; forming an overcladding layer so as to cover the core layer and the undercladding layer; stripping the releasable substrate from the metal foil; and etching the metal foil to thereby form a predetermined conductor pattern.

4 Claims, 1 Drawing Sheet

PROCESS FOR PRODUCING ELECTRO-OPTIC HYBRID CIRCUIT BOARD

FIELD OF THE INVENTION

The present invention relates to a process for producing an electro-optic hybrid circuit board.

BACKGROUND OF THE INVENTION

In the recent information communication technology, optical signals and electrical signals are mutually converted in conducting information communication. In such information communication, an electro-optic hybrid circuit board having both a wiring circuit board for transmitting electrical signals and an optical waveguide for transmitting light is used. As a technique for forming the conductor pattern serving as a constituent element of an electro-optic hybrid circuit board, the semi-additive method is known. (See patent document 1)

Patent Document 1: JP 2002-236228 A

In high-density information communication, there is a desire for size and thickness reductions in communication apparatus and also the electro-optic hybrid circuit boards are required to have a reduced transmission loss.

However, in forming a conductor pattern on an optical waveguide by the semi-additive method, there are cases where the resins constituting the optical waveguide degenerate due to the heat generated during sputtering, causing an increase in light transmission loss.

SUMMARY OF THE INVENTION

Accordingly, an object of the invention is to provide a process for electro-optic hybrid circuit board production by which a conductor pattern can be formed without increasing the light transmission loss of the optical waveguide.

Other objects and effects of the invention will become apparent from the following description.

In order to accomplish the objects, the invention provides a process for producing an electro-optic hybrid circuit board which comprises the steps of:

forming an undercladding layer on a metal foil side of a metal transfer sheet that comprises a releasable substrate and a metal foil formed thereon;

forming a core layer on the undercladding layer;

forming an overcladding layer so as to cover the core layer and the undercladding layer;

stripping the releasable substrate from the metal foil; and etching the metal foil to thereby form a predetermined conductor pattern.

According to the process of the invention for producing an electro-optic hybrid circuit board, an electro-optic hybrid circuit board can be produced while preventing the optical waveguide from increasing in light transmission loss.

BRIEF DESCRIPTION OF THE DRAWINGS

FIG. 1(a) shows the step of forming an undercladding layer on the metal foil of a transfer sheet; FIG. 1(b) shows the step of forming a core layer on the undercladding layer; and FIG. 1(c) shows the step of forming an overcladding layer to cover the core layer and the undercladding layer.

FIG. 2(a) shows the step of stripping off the releasable substrate of the transfer sheet; FIG. 2(b) shows the step of forming a conductor pattern from the metal foil by the subtractive method; and FIG. 2(c) shows the step of forming an insulating layer so as to cover the conductor pattern.

Figure 1:
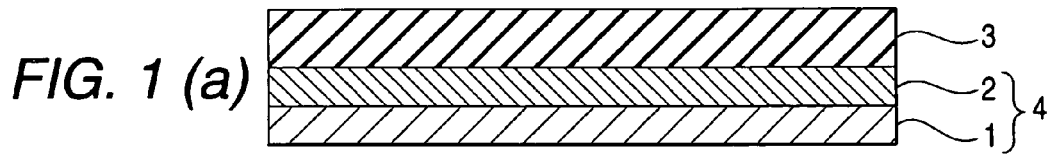
FIGS. 1(a) to 1(c) are sectional views showing steps in the process of the invention for producing an electro-optic hybrid circuit board.
Figure 1:
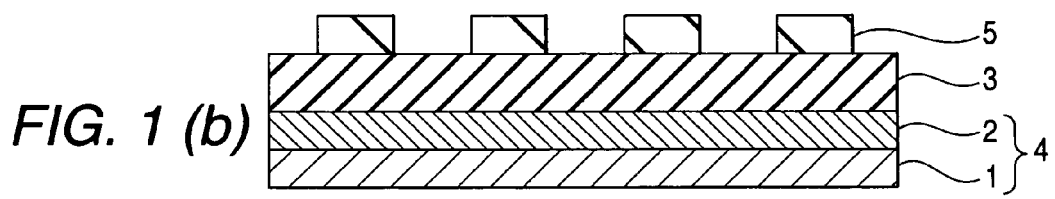
Figure 1:
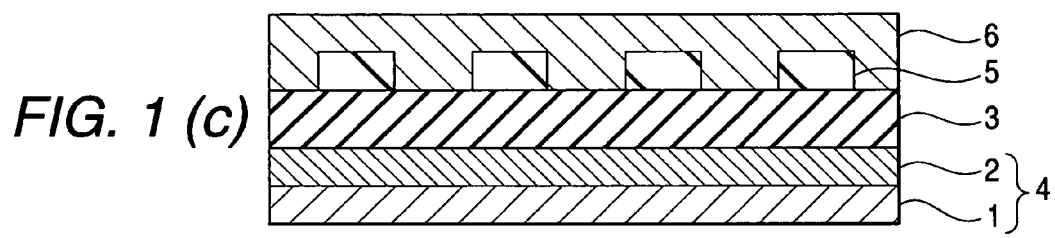

The reference numerals used in the drawings denote the followings, respectively.

1: Releasable substrate
2: Metal foil
3: Undercladding layer
4: Metal transfer sheet
5: Core layer
6: Overcladding layer
7: Conductor pattern
8: Insulating layer

DETAILED DESCRIPTION OF THE INVENTION

In the process of the invention for producing an electro-optic hybrid circuit board, a metal transfer sheet is prepared first. This metal transfer sheet comprises a releasable substrate and a metal foil formed thereon.

The releasable substrate may be either a metallic substrate or a resinous substrate. However, a metallic substrate is preferred when the heat resistance required for the formation of the undercladding layer which will be described below is taken into account. The releasable substrate is obtained by subjecting a surface of a metallic or resinous substrate to a releasability-imparting treatment.

The releasability-imparting treatment may be accomplished, for example, by modifying or oxidizing the surface of the metallic or resinous substrate by a plasma treatment or corona treatment. Alternatively, the treatment may be accomplished by forming a releasing layer, on the surface of the metallic or resinous substrate, from a material suitable for electrodeposition, such as a metal oxide, e.g., silicon oxide ($SiO_2$) or titanium oxide ($TiO_2$), a fluorine compound, a silicone compound, an acrylic compound, or a nitrogen-containing compound, e.g., a triazole compound.

The thickness of the releasable substrate is preferably 10 to 500 μm.

The material to be used for forming the metal foil is not particularly limited as long as it is a material capable of being processed into a wiring by etching. However, the metal foil preferably is a copper foil, nickel foil, aluminum foil, or the like.

The thickness of the metal foil is preferably 3 to 50 μm.

For forming a metal foil on the releasable substrate, for example, electrolytic metal plating may be used when the releasable substrate is a metallic substrate, and sputtering may be used when the releasable substrate is a resinous substrate.

The process of the invention for producing an electro-optic hybrid circuit board will be explained below by reference to FIG. 1 and FIG. 2.

First, as shown in FIG. 1(a), an undercladding layer 3 is formed on the metal foil 2 of the metal transfer sheet 4.

For forming the undercladding layer 3, a method in which a solution prepared by dissolving a resin for forming the undercladding layer 3 in a solvent is applied and dried to form the layer may be used.

The resin for forming the undercladding layer 3 is not particularly limited as long as it has transparency. Examples thereof include epoxy resins, poly(amic acid) resins, polyimide resins, and the like.

The thickness of the undercladding layer 3 is preferably 5 to 100 μm.

Subsequently, a core layer 5 having a predetermined pattern is formed on the undercladding layer 3 as shown in FIG. 1(*b*). Methods for forming the core layer 5 are not particularly limited. For example, the core layer 5 can be formed by exposing a photosensitive resin to light according to a predetermined pattern and then developing the resin. The photosensitive resin preferably is a photosensitive epoxy resin, photosensitive poly(amic acid) resin, photosensitive polyimide resin, or the like.

Usually, the core layer 5 is designed to have a higher refractive index than those of the undercladding layer 3 and the overcladding layer 6 described below.

The pattern of the core layer 5 preferably has a line width of 5 to 100 μm and the spacing between lines of 5 to 100 μm. The thickness of the core layer 5 is preferably 5 to 100 μm.

An overcladding layer 6 is then formed to cover the core layer 5 and the undercladding layer 3 as shown in FIG. 1(*c*). The overcladding layer 6 can be formed in the same manner as for the undercladding layer 3.

The thickness of the overcladding layer 6 is preferably 5 to 100 μm.

The resin to be used for forming the overcladding layer 6 is not particularly limited as long as it has transparency. Examples thereof include epoxy resins, poly(amic acid) resins, and polyimide resins. Usually, the same resin as that used for the undercladding resin 3 is used.

Figure 2:
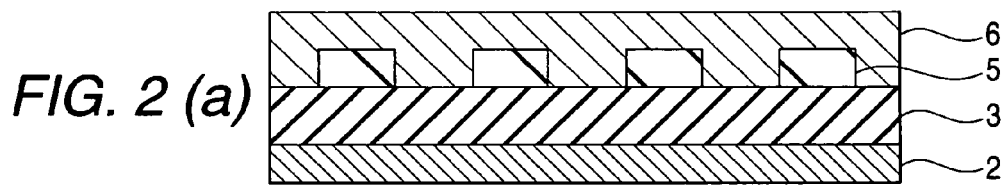
FIGS. 2(a) to 2(c) are sectional views showing steps in the process of the invention for producing an electro-optic hybrid circuit board.
Figure 2:
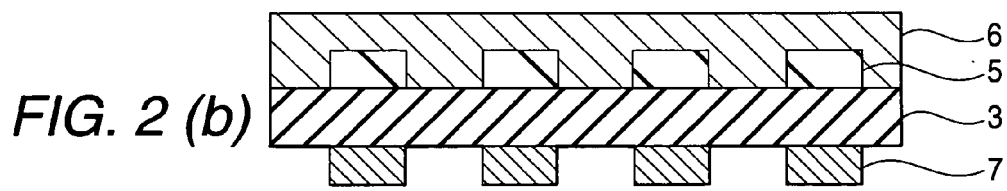
Figure 2:
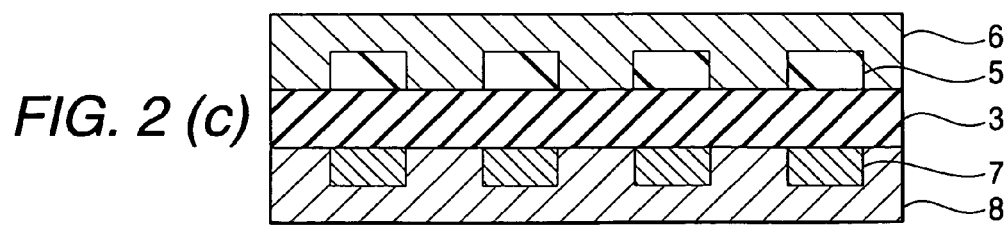

Subsequently, the releasable substrate 1 is stripped off as shown in FIG. 2(*a*). A conductor pattern 7 having a predetermined shape such as that shown in FIG. 2(*b*) is then formed by the so-called subtractive method, i.e., by removing the unnecessary parts of the metal foil 2 by etching.

According to need, an insulating layer 8 is subsequently formed to cover the conductor pattern 7 as shown in FIG. 2 (*c*). For forming the insulating layer 8, a method in which a solution prepared by dissolving a resin for forming the insulating layer 8 in a solvent is applied and dried to form the layer may be used.

The resin for forming the insulating layer 8 is not particularly limited as long as it has insulating properties. Examples thereof include synthetic resins such as polyimide resins, poly(amide-imide) resins, acrylic resins, polyether nitrile resins, polyethersulfone resins, poly(ethylene terephthalate) resins, poly(ethylene naphthalate) resins, poly(vinyl chloride) resins, epoxy resins, and polyurethane resins. From the standpoint of heat resistance, it is preferred to use a polyimide resin.

The thickness of the insulating layer 8 is preferably 5 to 50 μm.

Openings in which the conductor pattern is exposed may be formed in the insulating layer 8 according to need so that the exposed parts of the conductor pattern serve as terminal parts for connection to electronic parts.

EXAMPLES

The present invention will be illustrated in greater detail with reference to the following Examples, but the invention should not be construed as being limited thereto.

Example 1

First, according to the formulations shown in Table 1, the ingredients were mixed together and dissolved using cyclohexanone as a solvent. Thus, varnishes A and B were prepared. For each varnish, the refractive index of a cured resin obtained by curing the varnish, as measured at a wavelength of 633 nm, is also shown in Table 1.

TABLE 1

| Varnish | (parts by weight) | |
|---|---|---|
| | A | B |
| Fluorene derivative 1 | 83 | 67 |
| Fluorene derivative 2 | — | 33 |
| Diluent | 17 | — |
| Photo-acid generator | 1 | 1 |
| Refractive index of cured resin (measuring wavelength, 633 nm) | 1.585 | 1.615 |

Fluorene derivative 1: bisphenoxyethanolfluorene diglycidyl ether (represented by general formula (1) wherein $R_1$ to $R_6$ each are a hydrogen atom and n is 1)
Fluorene derivative 2: bisphenolfluorene diglycidyl ether (represented by general formula (1) wherein $R_1$ to $R_6$ each are a hydrogen atom and n is 0)
Diluent: 3,4-epoxycyclohexenylmethyl 3',4'-epoxycyclohexenecarboxylate (Celoxide 2021P, manufactured by Daicel Chemical Industries, Ltd.)
Photo-acid generator: 50% propylene carbonate solution of 4,4-bis [di(β-hydroxyethoxy)phenylsulfinio]phenyl sulfide bishexafluoroantimonate

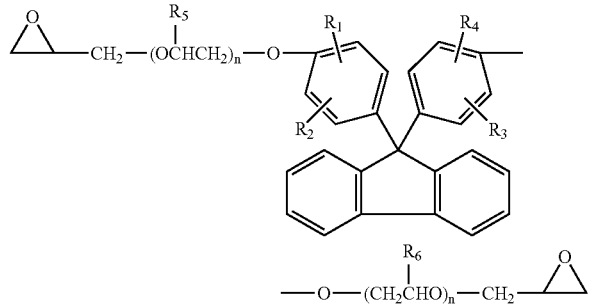

(1)

A metal transfer sheet (MT35S, manufactured by Mitsui Mining & Smelting Co., Ltd.) was prepared which was composed of a copper substrate having a releasability-imparted surface and a thickness of 35 μm and a copper foil formed thereon having a thickness of 5 μm.

Varnish A was applied on the surface of the copper foil by spin coating and dried at 100° C. for 15 minutes to form a resin layer. Thereafter, the resin layer was wholly irradiated with ultraviolet in an exposure dose of 2,000 mJ/cm² and then heated at 100° C. for 20 minutes to form an undercladding layer having a thickness of 20 μm (see FIG. 1(*a*)).

Subsequently, varnish B was applied on the undercladding layer by spin coating and dried at 100° C. for 30 minutes to form a resin layer. A photomask having a linear optical-waveguide pattern with a line width of 50 μm (chrome mask based on synthetic quartz) was then used to irradiate the resin layer with ultraviolet by the contact exposure method in an exposure dose of 2,000 mJ/cm².

Thereafter, post-exposure heating was conducted at 100° C. for 60 minutes. The resultant structure was immersed in an acetonitrile-based developing liquid. The resin layer was thus developed to obtain a pattern. Thereafter, the resin layer was heated at 100° C. for 10 minutes to remove the acetonitrile remaining in the resin. Thus, a core layer having a square section with a thickness of 50 μm and a width of 50 μm was formed with the spacing between lines of 250 μm (see FIG. 1(b)).

Varnish A was applied by spin coating on the undercladding layer and the core layer and dried at 100° C. for 20 minutes to form a resin layer. Thereafter, the resin layer was wholly irradiated with ultraviolet in an exposure dose of 3,000 mJ/cm$^2$ and then heated at 100° C. for 30 minutes to form an overcladding layer having a thickness of 80 μm (see FIG. 1(c)).

Thus, an optical waveguide part was formed on the copper foil of the metal transfer sheet.

Subsequently, the copper substrate was stripped off (see FIG. 2(a)), and a photoresist was superposed on the copper foil on the side thereof opposite to the optical waveguide part. The photoresist was exposed and developed to thereby form a resist pattern. Thereafter, those parts of the copper foil which were exposed without being covered with the resist pattern were etched to form a conductor pattern having a line width of 25 μm and the spacing between lines of 25 μm. The photoresist was stripped off (see FIG. 2(b)).

A poly(amic acid) solution was applied over the resultant conductor pattern, dried, and then heated to imidize the polymer. Thus, an insulating layer having a thickness of 25 μm which was made of a polyimide was formed (see FIG. 2(c)).

The optical waveguide part of the electro-optic hybrid circuit board thus produced was evaluated for light transmission. As a result, the light transmission loss thereof was found to be 0.1 dB/cm.

Comparative Example 1

An optical waveguide part was produced on a silicon substrate in the same manner as in Example 1. Thereafter, a conductor pattern was formed on the surface of the overcladding layer of the optical waveguide part by the semi-additive method.

Namely, a chromium foil having a thickness of 0.01 μm and a copper foil having a thickness of 0.15 μm were successively formed as metal foils on the overcladding layer by sputtering. Thereafter, a plating resist having a pattern which was the reverse of the conductor pattern was formed on the metal foil. Electroplating of copper was then conducted to form a metallic wiring constituted of 20 μm-thick copper. This wiring was a conductor pattern having a metallic-wiring line width of 25 μm and the spacing between metallic-wiring lines of 25 μm. Thereafter, the plating resist was removed and those parts of the thin metal film which were exposed without being covered with the conductor pattern were removed by wet etching.

A poly(amic acid) solution was applied so as to cover the conductor pattern, dried, and then heated to imidize the polymer, thereby forming an insulating layer made of a polyimide and having a thickness of 25 μm. Thus, an electro-optic hybrid circuit board was obtained.

As a result, the epoxy resin discolored due to the heat generated during the sputtering.

The optical waveguide part of the electro-optic hybrid circuit board produced was evaluated for light transmission. As a result, the light transmission loss thereof was found to be 1 dB/cm.

While the present invention has been described in detail and with reference to specific embodiments thereof, it will be apparent to one skilled in the art that various changes and modifications can be made therein without departing from the spirit and scope thereof.

This application is based on Japanese Patent Application NO. 2004-340124 filed Nov. 25, 2004, the contents thereof being herein incorporated by reference.

The invention claimed is:

1. A process for producing an electro-optic hybrid circuit board, which comprises the steps of:
   forming an undercladding layer on a metal foil side of a metal transfer sheet that comprises a releasable substrate and a metal foil formed thereon;
   forming a core layer on the undercladding layer;
   forming an overcladding layer so as to cover the core layer and the undercladding layer;
   stripping the releasable substrate from the metal foil; and
   etching the metal foil to thereby form a predetermined conductor pattern.

2. The process for producing an electro-optic hybrid circuit board of claim 1, wherein the releasable substrate is a metallic substrate having a surface treated by a releasability-imparting treatment.

3. The process for producing an electro-optic hybrid circuit board of claim 2, wherein the releasability-imparting treatment is a plasma treatment or a corona treatment.

4. The process for producing an electro-optic hybrid circuit board of claim 1, wherein the metal foil is a copper foil, a nickel foil or an aluminum foil.

* * * * *